US012787556B2

(12) United States Patent
Naganuma

(10) Patent No.: US 12,787,556 B2
(45) Date of Patent: Nov. 3, 2026

(54) DISPLAY DEVICE

(71) Applicant: Magnolia White Corporation, Tokyo (JP)

(72) Inventor: Tomohiko Naganuma, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 351 days.

(21) Appl. No.: 18/495,769

(22) Filed: Oct. 27, 2023

(65) Prior Publication Data

US 2024/0147777 A1 May 2, 2024

(30) Foreign Application Priority Data

Oct. 31, 2022 (JP) ................................ 2022-174379

(51) Int. Cl.
*H10K 59/122* (2023.01)
*H10K 59/80* (2023.01)

(52) U.S. Cl.
CPC ....... *H10K 59/122* (2023.02); *H10K 59/8792* (2023.02)

(58) Field of Classification Search
CPC ......................... H10K 59/122; H10K 59/8792
USPC ......................................................... 313/500
See application file for complete search history.

(56) References Cited

U.S. PATENT DOCUMENTS

2016/0322437 A1 11/2016 Sakamoto et al.
2017/0213882 A1* 7/2017 Teramoto ............. H10K 59/121
2021/0335920 A1* 10/2021 Hong .................. H10K 59/352

FOREIGN PATENT DOCUMENTS

JP 2013-020744 A 1/2013
JP 2015-149231 A 8/2015
JP 2016-212979 A 12/2016

OTHER PUBLICATIONS

Espacenet Patent Search Complete (Global Dossier) (Year: 2024).*

* cited by examiner

*Primary Examiner* — James R Greece
*Assistant Examiner* — Hana S Featherly
(74) *Attorney, Agent, or Firm* — XSENSUS LLP

(57) ABSTRACT

A display device includes: a substrate; first banks each having a protruding shape, provided on the substrate, and including a flat portion and an inclined portion; light-emitting elements including pixel electrodes, a light-emitting layer, and counter electrodes stacked on the first banks in the order as listed; a sealing film; color filters; and a light-blocking layer. Each pixel electrode includes a pixel electrode flat portion provided on the flat portion of the first bank and a pixel electrode inclined portion on the inclined portion of the first bank. Each counter electrode is made of a transflective metal film and includes a counter electrode flat portion provided along the pixel electrode flat portion in an area overlapping the flat portion of the first bank and a counter electrode inclined portion provided along the pixel electrode inclined portion in an area overlapping the inclined portion of the first bank.

20 Claims, 9 Drawing Sheets

DISPLAY DEVICE

CROSS-REFERENCE TO RELATED APPLICATION

This application claims the benefit of priority from Japanese Patent Application No. 2022-174379 filed on Oct. 31, 2022, the entire contents of which are incorporated herein by reference.

BACKGROUND

1. Technical Field

What is disclosed herein relates to a display device.

2. Description of the Related Art

The organic electroluminescent (EL) device described in Japanese Patent Application Laid-open Publication No. 2013-20744 (JP-A-2013-20744) includes a plurality of organic EL elements formed on a substrate, a protective layer (sealing film) covering the organic EL elements, a color filter layer stacked on the protective layer, and a light-blocking layer formed on the color filter layer. In the technology described in JP-A-2013-20744, a transflective metal film is used as a cathode, and what is called a microcavity structure is employed.

In organic EL display devices with no circularly polarizing plate, external light may possibly be reflected on pixel electrodes (reflective electrodes), resulting in reduced contrast. If a transflective metal film is used as a cathode, external light may possibly be reflected also on the cathode.

The technology described in Japanese Patent Application Laid-open Publication No. 2016-212979 (JP-A-2016-212979) reduces color mixing of light by disposing electrodes on banks. The technology described in Japanese Patent Application Laid-open Publication No. 2015-149231 (JP-A-2015-149231) reduces reflection of external light with pixel electrodes having an inclined surface. In both the technologies described in JP-A-2016-212979 and JP-A-2015-149231, however, a transparent electrode is used as a cathode, and reflection of external light on the cathode is not considered.

SUMMARY

According to an aspect, a display device includes: a substrate; a plurality of first banks each having a protruding shape, provided on the substrate, and including a flat portion and an inclined portion provided to a periphery of the flat portion; a plurality of light-emitting elements including pixel electrodes, a light-emitting layer, and counter electrodes stacked on the first banks in the order as listed; a sealing film covering the light-emitting elements; a plurality of color filters that are provided on the sealing film to be in direct contact with the sealing film and are colored corresponding to the pixel electrodes; and a light-blocking layer provided between adjacent pixel electrodes of the pixel electrodes in plan view. Each pixel electrode includes a pixel electrode flat portion provided on the flat portion of a corresponding one of the first banks and a pixel electrode inclined portion inclined with respect to the substrate on the inclined portion of the corresponding first bank. Each counter electrode is made of a transflective metal film and includes a counter electrode flat portion provided along the pixel electrode flat portion in an area overlapping the flat portion of the first bank and a counter electrode inclined portion provided along the pixel electrode inclined portion in an area overlapping the inclined portion of the first bank.

DETAILED DESCRIPTION

Figure 1:
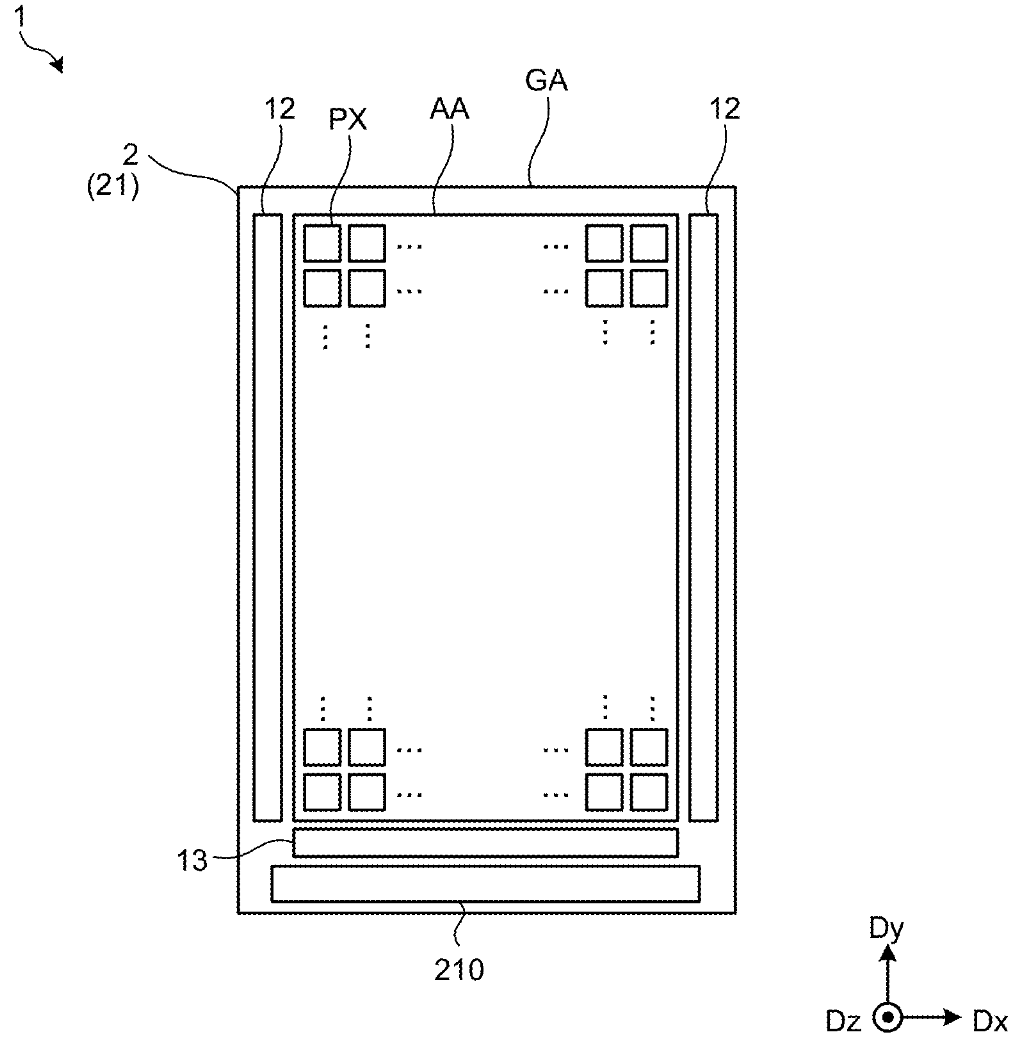
FIG. 1 is a plan view schematically illustrating a display device according to a first embodiment.

Exemplary aspects (embodiments) to embody the present disclosure are described below in greater detail with reference to the accompanying drawings. The contents described in the embodiments below are not intended to limit the present disclosure. Components described below include components easily conceivable by those skilled in the art and components substantially identical therewith. Furthermore, the components described below may be appropriately combined. What is disclosed herein is given by way of example only, and appropriate modifications made without departing from the spirit of the present disclosure and easily conceivable by those skilled in the art naturally fall within the scope of the present disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present disclosure and the figures, components similar to those previously described with reference to previous figures are denoted by the same reference numerals, and detailed explanation thereof may be appropriately omitted.

When the term "on" is used to describe an aspect where a first structure is disposed on a second structure in the present specification and the claims, it includes both of the following cases unless otherwise noted: a case where the first structure is disposed directly on and in contact with the second structure, and a case where the first structure is disposed above the second structure with another structure interposed therebetween.

First Embodiment

FIG. 1 is a plan view schematically illustrating a display device according to a first embodiment. A display device 1 according to the present embodiment is an organic EL display device including organic light-emitting diodes (OLED) serving as self-luminous elements. The display device 1 includes an array substrate 2, pixels PX, a scanning line drive circuit 12, a signal line drive circuit 13, and a drive integrated circuit (IC) 210.

The array substrate 2 is a drive circuit substrate for driving the pixels PX and is also called a backplane or an active matrix substrate. The array substrate 2 is formed using a substrate 21 as a base and includes a plurality of transistors, a plurality of capacitors, various kinds of wiring, and other components on the substrate 21. A wiring substrate (e.g., flexible printed circuits (FPCs)), which is not particularly illustrated, may be coupled on the array substrate 2 to receive various control signals and electric power from an external control substrate.

In the following description, a first direction Dx is a direction in a plane parallel to the substrate 21. A second direction Dy is a direction in the plane parallel to the substrate 21 and is orthogonal to the first direction Dx. The second direction Dy may intersect the first direction Dx without being orthogonal thereto. A third direction Dz is a direction orthogonal to the first direction Dx and the second direction Dy and is the normal direction of the substrate 21. The term "plane view" refers to the positional relation when viewed in the third direction Dz.

The scanning line drive circuit 12 is a drive circuit that supplies signals to scanning lines (not illustrated) in a display region AA to drive the pixels PX. The signal line drive circuit 13 is a drive circuit that supplies pixel signals to signal lines (not illustrated) in the display region AA to drive the pixels PX. The drive IC 210 is a circuit that supplies control signals to the scanning line drive circuit 12 and the signal line drive circuit 13 to control display of the pixels PX. At least part of the scanning line drive circuit 12 and the signal line drive circuit 13 may be formed integrally with the drive IC 210. The drive IC 210 is provided on the array substrate 2. The configuration is not limited thereto, and the drive IC 210 may be provided to a wiring substrate coupled to the array substrate 2.

The array substrate 2 has a display region AA and a peripheral region GA. The pixels PX are provided in the display region AA. The pixels PX are arrayed in a matrix (row-column configuration) in the display region AA. The peripheral region GA is a region outside the display region AA and is not provided with the pixels PX. The scanning line drive circuit 12, the signal line drive circuit 13, and the drive IC 210 are provided in the peripheral region GA. The scanning line drive circuit 12 is provided in the area extending along the second direction Dy in the peripheral region GA. The signal line drive circuit 13 and the drive IC 210 are provided in the area extending along the first direction Dx in the peripheral region GA.

To simplify the explanation, the display region AA according to the present embodiment has a rectangular shape, and the peripheral region GA has a rectangular frame shape surrounding the display region AA. The configuration is not limited thereto, and the display region AA may have a polygonal shape or an irregular shape with a cutout (notch) or a curved portion in part of its outer periphery. The peripheral region GA may have another shape corresponding to the shape of the display region AA.

Figure 2:
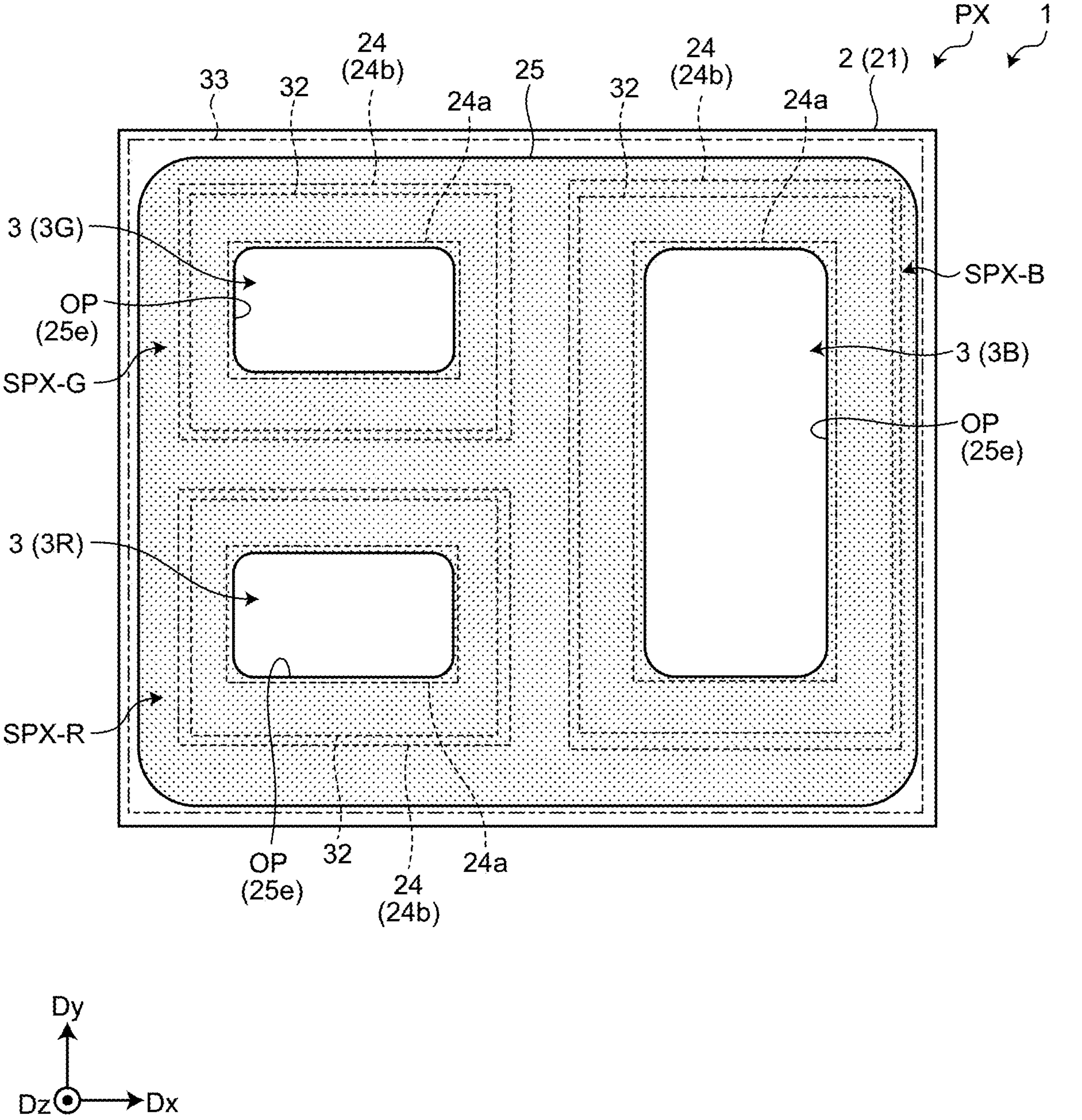
FIG. 2 is a plan view of the configuration of first banks, a second bank, pixel electrodes, and a counter electrode of a pixel according to the first embodiment.
Figure 3:
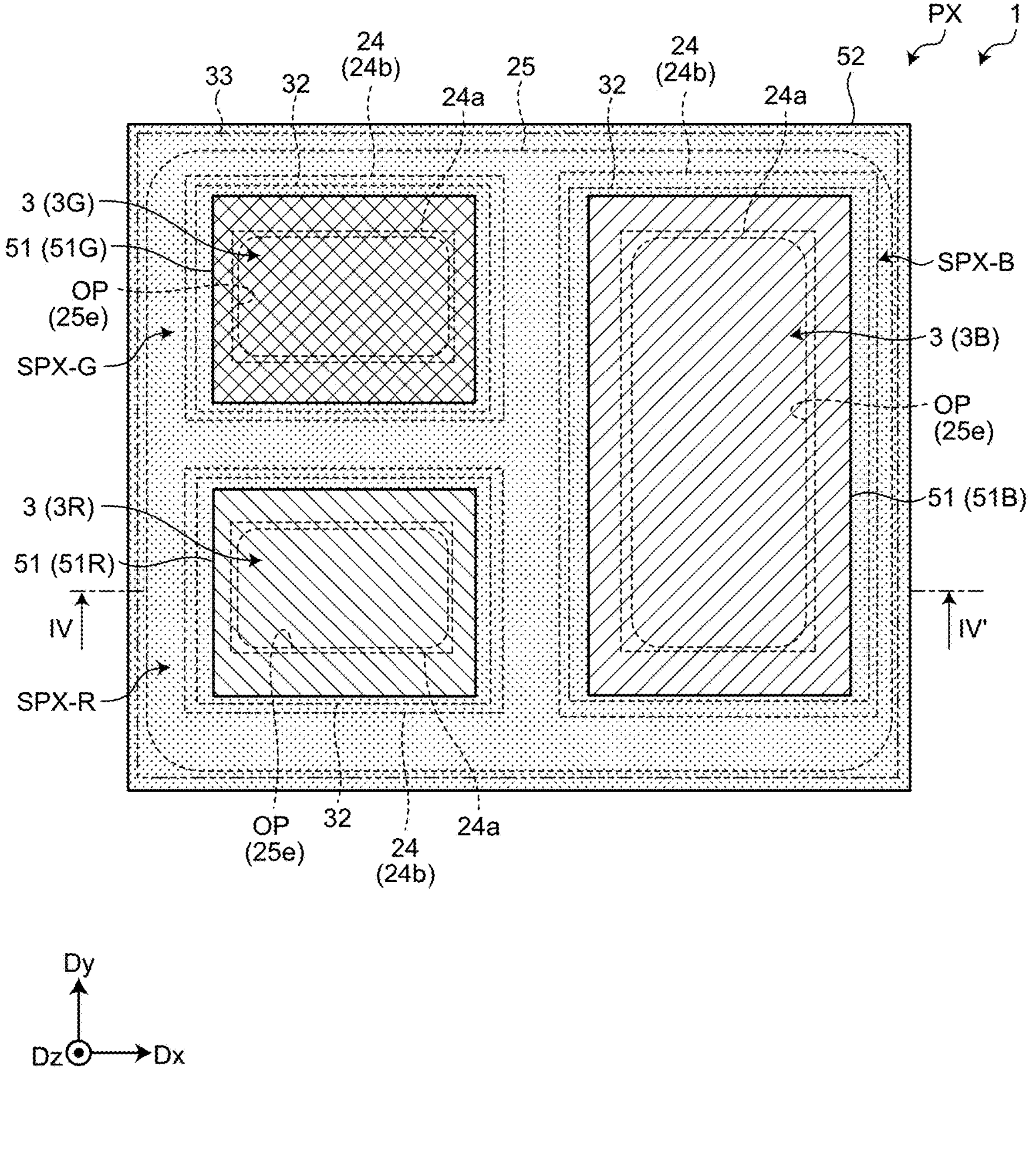
FIG. 3 is a plan view of the configuration of a light-blocking layer and color filters of the pixel according to the first embodiment.

FIG. 2 is a plan view of the configuration of first banks, a second bank, pixel electrodes, and a counter electrode of a pixel according to the first embodiment. FIG. 3 is a plan view of the configuration of a light-blocking layer and color filters of the pixel according to the first embodiment. FIG. 2 is a plan view of part of the pixel PX according to the first embodiment. Specifically, FIG. 2 is a schematic plan view not illustrating a light-blocking layer 52 and color filters 51 illustrated in FIG. 3.

As illustrated in FIGS. 2 and 3, the pixel PX includes sub-pixels SPX-R, SPX-G, and SPX-B. The sub-pixels SPX-R, SPX-G, and SPX-B each include an organic light-emitting diode as a light-emitting element 3 (refer to FIG. 3). In the following description, the sub-pixels SPX-R, SPX-G, and SPX-B are simply referred to as sub-pixels SPX when they need not be distinguished from one another.

The sub-pixel SPX-R displays red (R), for example. The sub-pixel SPX-G displays green (G), for example. The sub-pixel SPX-B displays blue (B), for example. The sub-pixel SPX-R and the sub-pixel SPX-G are adjacently disposed in the second direction Dy. One sub-pixel SPX-B is disposed adjacently in the first direction Dx to the sub-pixels SPX-R and SPX-G adjacently disposed in the second direction Dy. The configuration is not limited thereto, and the pixel PX may be configured in other arrangements. For example, the sub-pixels SPX-R, SPX-G, and SPX-B may be adjacently disposed in the first direction Dx. The pixel PX may be configured in what is called a PenTile array. The pixel PX is not necessarily including three sub-pixels SPX and may include four or more sub-pixels SPX.

As illustrated in FIG. 2, the display device 1 includes the substrate 21, first banks 24, second banks 25, and the light-emitting elements 3 (light-emitting elements 3R, 3G, and 3B). The light-emitting elements 3 each include a light-emitting layer 31 (refer to FIG. 4), a pixel electrode 32, and a counter electrode 33.

The first banks 24 are provided on the substrate 21 in a manner spaced apart corresponding to the sub-pixels SPX. More specifically, the first bank 24 of the sub-pixel SPX-R and the first bank 24 of the sub-pixel SPX-G are adjacently disposed in the second direction Dy with a space interposed therebetween. The first bank 24 of the sub-pixel SPX-B is disposed adjacently to the first bank 24 of the sub-pixel SPX-R and the first bank 24 of the sub-pixel SPX-G in the first direction Dx with a space interposed therebetween. The first bank 24 is formed in a protruding shape with a flat portion 24*a* and an inclined portion 24*b* provided to the periphery of the flat portion 24*a*.

A plurality of pixel electrodes 32 are provided to the respective first banks 24 of the sub-pixels SPX and are spaced apart corresponding to the sub-pixels SPX. The counter electrodes 33 are continuously provided over the light-emitting elements 3R, 3G, and 3B (sub-pixels SPX). In other words, the counter electrodes 33 are provided covering the plurality of pixel electrodes 32.

The second bank 25 covers a plurality of first banks 24 and a plurality of pixel electrodes 32 in plan view and has openings OP in the areas overlapping the flat portions 24*a* of the first banks 24. In other words, the second bank 25 is provided between the adjacent first banks 24 (between the adjacent pixel electrodes 32) and covers the inclined portions 24*b* of the first banks 24 and the peripheral portions (pixel electrode inclined portions 32*b* (refer to FIG. 3)) of the pixel electrodes 32. Light from the light-emitting elements 3R, 3B, and 3G is output to the outside through the opening OP. The configuration of the first bank 24, the second bank 25, the pixel electrode 32, and the counter electrode 33 will be described later in greater detail with reference to FIG. 4.

As illustrated in FIG. 3, the display device 1 further includes the color filters 51 and the light-blocking layer 52. The color filters 51 are provided overlapping the respective light-emitting elements 3. Each of the color filters 51 includes a colored layer colored in the same color as that of light output from the corresponding light-emitting elements 3. In other words, color filters 51R, 51G, and 51B are provided overlapping the light-emitting elements 3R, 3G, and 3B, respectively. The color filter 51R is formed of a red colored layer and transmits red light. The color filter 51G is formed of a green colored layer and transmits green light. The color filter 51B is formed of a blue colored layer and transmits blue light.

The light-blocking layer 52 is provided between the adjacent sub-pixels SPX (pixel electrodes 32) and partitions the sub-pixels SPX. The light-blocking layer 52 has openings in the areas each including the opening OP of the second bank 25 and the pixel electrode 32 provided around the opening OP.

To make the drawing easy to see, FIG. 3 schematically illustrates the color filters 51R, 51G, and 51B only at the openings of the light-blocking layer 52. The color filters 51R, 51G, and 51B, however, are provided also overlapping part of the light-blocking layer 52.

Figure 4:
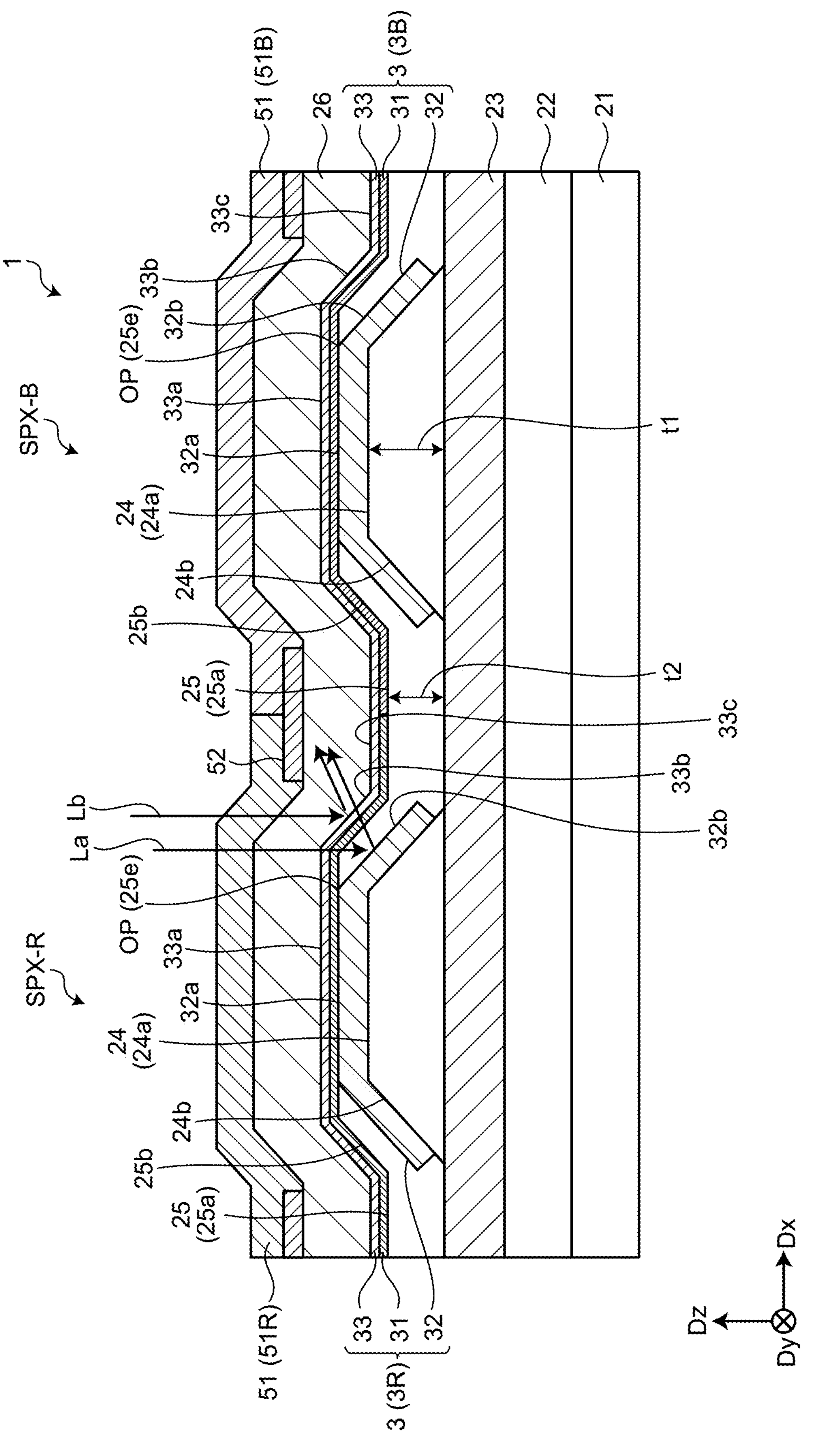
FIG. 4 is a sectional view along line IV-IV' of FIG. 3.

The following describes a sectional configuration of the display device 1. FIG. 4 is a sectional view along line IV-IV' of FIG. 3. FIG. 4 illustrates the sectional configuration of the sub-pixel SPX-B and the sub-pixel SPX-R. The sectional configuration of the sub-pixel SPX-G is the same as that of each of the sub-pixel SPX-B and the sub-pixel SPX-R, so the description of the sub-pixel SPX-B and the sub-pixel SPX-R can also be applied to the sub-pixel SPX-G.

In the following description, the direction from the substrate 21 to the color filter 51 in the direction perpendicular to the surface of the substrate 21 (third direction Dz) is referred to as an "upper side" or simply as "up". The direction from the color filter 51 to the substrate 21 is referred to as a "lower side" or simply as "down".

As illustrated in FIG. 4, the display device 1 further includes a circuit formation layer 22, a planarization film 23, and a sealing film 26 provided on the substrate 21.

The substrate 21 is an insulating substrate and is a glass substrate made of quartz or alkali-free glass or a resin substrate made of polyimide, for example. When a flexible resin substrate is used as the substrate 21, the display device 1 can be configured as a sheet display. The substrate 21 is not necessarily made of polyimide and may be made of other resin materials.

The circuit formation layer 22 is a layer on the substrate 21 provided with transistors and various kinds of wiring (not illustrated) for driving the light-emitting elements 3. The planarization film 23 is provided on the circuit formation layer 22 to cover the transistors and the various kinds of wiring on the circuit formation layer 22. The planarization film 23 is made of organic insulating material, such as photosensitive acrylic.

The first bank 24 and the second bank 25 are provided on the planarization film 23 on the upper side of the substrate 21. The first bank 24 has a protruding shape with the flat portion 24*a* and the inclined portion 24*b*. The inclined portion 24*b* is provided to the periphery of the flat portion 24*a* and is formed thinner as away from the flat portion 24*a* to the periphery (e.g., in the first direction Dx). The inclined portion 24*b* is provided along the four sides of the flat portion 24*a* in plan view.

The second bank 25 is provided between the adjacent first banks 24. More specifically, the second bank 25 has a recessed shape with a bottom portion 25*a* and a wall portion 25*b*. The bottom portion 25*a* is provided between the adjacent first banks 24 on the planarization film 23. The wall portion 25*b* is inclined upward from the bottom portion 25*a* and covers the inclined portion 24*b* of the first bank 24. The second bank 25 has the opening OP in the area overlapping the flat portion 24*a* of the first bank 24.

The thickness t1 of the flat portion 24*a* of the first bank 24 in the third direction Dz is greater than the thickness t2 of the bottom portion 25*a* of the second bank 25. For example, the thickness t1 of the flat portion 24*a* of the first bank 24 is approximately 2 μm, and the thickness t2 of the bottom portion 25*a* of the second bank 25 is approximately 1 μm to 1.5 μm. The first bank 24 and the second bank 25 are made of organic insulating material. The first bank 24 and the second bank 25 may be made of the same material or different materials.

The light-emitting element 3 includes the light-emitting layer 31, the pixel electrode 32, and the counter electrode 33. The light-emitting element 3 includes the pixel electrode 32, the light-emitting layer 31, and the counter electrode 33 that are stacked in this order on the first bank 24.

The pixel electrode 32 has a protruding shape to cover the first bank 24. More specifically, the pixel electrode 32 includes a pixel electrode flat portion 32*a* and a pixel electrode inclined portion 32*b*. The pixel electrode flat portion 32*a* is provided on the flat portion 24*a* of the first bank 24 and is substantially parallel to the substrate 21. The pixel electrode inclined portion 32*b* is provided on the inclined portion 24*b* of the first bank 24 and is inclined with respect to the substrate 21. The pixel electrode inclined portion 32*b* is provided to the periphery of the pixel electrode flat portion 32*a* in plan view. When the pixel electrode flat portion 32*a* has a quadrilateral shape, the pixel electrode inclined portion 32*b* is provided along the four sides of the pixel electrode flat portion 32*a*.

The pixel electrode flat portion 32*a* is provided in the area overlapping the opening OP of the second bank 25. The wall portion 25*b* of the second bank 25 is provided covering the pixel electrode inclined portion 32*b*. In other words, the second bank 25 is provided between the adjacent pixel electrodes 32 and is formed as an insulating film serving as a partition wall between the adjacent sub-pixels SPX. The upper end (opening end 25*e*) of the wall portion 25*b* of the second bank 25 is flush with the pixel electrode flat portion 32*a*. The configuration is not limited thereto, and the upper end (opening end 25*e*) of the wall portion 25*b* of the second bank 25 may be different in height from the pixel electrode flat portion 32*a*.

The pixel electrode 32 is the anode of the light-emitting element 3 and is formed as a reflective electrode. The pixel electrode 32 is made of metal material, such as silver (Ag). The configuration is not limited thereto, and the pixel electrode 32 may be made of other metal materials other than silver (Ag) or alloy. Alternatively, the pixel electrode 32 may be a multilayered film composed of light-transmitting conductive material and metal material.

The light-emitting layer 31 is provided on the pixel electrode 32. More specifically, the light-emitting layer 31 is provided on the pixel electrode flat portion 32*a* and the wall portion 25*b* and the bottom portion 25*a* of the second bank 25. In the pixel electrode 32, the pixel electrode flat portion 32*a* is in direct contact with the light-emitting layer 31, and the wall portion 25*b* of the second bank 25 is disposed between the pixel electrode inclined portion 32*b* and the light-emitting layer 31.

The light-emitting layer 31 is formed by an organic electroluminescent (EL) layer. While the configuration of the light-emitting layer 31 is illustrated as a simplified single layer in FIG. 4, the light-emitting layer 31 is formed such that a hole transport layer, an electron transport layer, and the like are stacked therein. The light-emitting layer 31 is selectively formed for each sub-pixel SPX.

The counter electrodes 33 are provided on the light-emitting layer 31. The counter electrodes 33 are provided over the display region AA (refer to FIG. 1) to cover the light-emitting layers 31 of the sub-pixels SPX. More specifically, the counter electrode 33 includes a counter electrode flat portion 33*a*, a counter electrode inclined portion 33*b*, and a counter electrode bottom portion 33*c*.

The counter electrode flat portion 33*a* is provided along the pixel electrode flat portion 32*a* in the area overlapping the flat portion 24*a* of the first bank 24. The counter electrode flat portion 33*a* is provided substantially parallel to the substrate 21. The counter electrode inclined portion 33*b* is provided along the pixel electrode inclined portion 32*b* in the area overlapping the inclined portion 24*b* of the first bank 24 and the wall portion 25*b* of the second bank 25. The counter electrode inclined portion 33*b* is inclined with respect to the substrate 21. The counter electrode bottom portion 33*c* is provided along the bottom portion 25*a* of the second bank 25 in the area overlapping the bottom portion 25*a* of the second bank 25. The counter electrode bottom portion 33*c* couples the counter electrodes 33 (the counter electrode flat portions 33*a* and the counter electrode inclined portions 33*b*) of the adjacent sub-pixels SPX.

The counter electrode 33 needs to have a light-transmitting property because the display device 1 according to the present embodiment employs the top emission structure. The counter electrode 33 is made of a transflective metal film (e.g., MgAg) and is formed as a thin film thin enough to transmit light output from the light-emitting layer 31. In the present embodiment, the pixel electrode 32 serves as an anode, and the counter electrode 33 serves as a cathode. The thickness of the pixel electrode 32 is approximately 100 nm or smaller, and the thickness of the counter electrode 33 is approximately 10 nm to 15 nm, for example. The thicknesses of the pixel electrode 32 and the counter electrode 33 are given by way of example only and can be appropriately changed.

The counter electrodes 33 are formed over the display region AA and a cathode contact portion (not illustrated) provided near the display region AA, and are coupled to a conductive layer of the circuit formation layer 22 at the cathode contact portion.

The sealing film 26 is provided on the counter electrodes 33 to cover the light-emitting elements 3. The sealing film 26 is an inorganic film, such as a silicon nitride film and an aluminum oxide film, or a resin film, such as acrylic. The sealing film 26 is not limited to a single layer and may be a multilayered film of two or more layers obtained by combining the inorganic film and the resin film described above. The sealing film 26 satisfactorily seals the light-emitting elements 3 and can reduces moisture entering from the upper surface.

The color filters 51 are provided on the sealing film 26 to be in direct contact with the sealing film 26. The color filters 51 include the color filters 51R, 51G, and 51B (the color filter 51G is not illustrated in FIG. 4) colored in different colors corresponding to the sub-pixels SPX. In the adjacent sub-pixels SPX-R and SPX-B, the periphery of the color filter 51R and the periphery of the color filter 51B are in contact with each other in the first direction Dx. The configuration is not limited thereto, and the periphery of the color filter 51R and the periphery of the color filter 51B may overlap in the third direction Dz.

The light-blocking layer 52 is provided between the adjacent sub-pixels SPX and is stacked between the sealing film 26 and the color filter 51 in the third direction Dz. The light-blocking layer 52 is also called a black matrix. More specifically, the light-blocking layer 52 is provided overlapping the boundary between the periphery of the color filter 51R and the periphery of the color filter 51B disposed adjacently. The light-blocking layer 52 is provided in the area overlapping the bottom portion 25*a* of the second bank 25 and has the opening in the area overlapping the first bank 24 and the pixel electrode 32. The opening of the light-blocking layer 52 is formed over the area overlapping the flat portion 24*a* (pixel electrode flat portion 32*a*) of the first bank 24 and the inclined portion 24*b* (pixel electrode inclined portion 32*b*) on the periphery of the flat portion 24*a*.

As described above, in the display device 1 according to the present embodiment, the pixel electrode 32 (pixel electrode flat portion 32*a*), the light-emitting layer 31, the counter electrode 33 (counter electrode flat portion 33*a*), the sealing film 26, and the color filter 51 are stacked in this order in the area overlapping the flat portion 24*a* of the first bank 24. The pixel electrode 32 (pixel electrode inclined portion 32*b*), the wall portion 25*b* of the second bank 25, the light-emitting layer 31, the counter electrode 33 (counter electrode inclined portion 33*b*), the sealing film 26, and the color filter 51 are stacked in this order in the area overlapping the inclined portion 24*b* of the first bank 24. The light-emitting layer 31, the counter electrode 33 (counter electrode bottom portion 33*c*), the sealing film 26, the light-blocking layer 52, and the color filter 51 are stacked in this order in the area overlapping the bottom portion 25*a* of the second bank 25.

In other words, in the configuration where the light-emitting element 3 (the pixel electrode 32, the light-emitting layer 31, and the counter electrode 33) is provided covering the protruding first bank 24, the effective light-emitting portion of the light-emitting element 3 is formed in the area overlapping the flat portion 24*a* of the first bank 24. Light output from the light-emitting portion of the light-emitting layer 31 mainly travels in the third direction Dz, and emission of light in an oblique direction is reduced in the area overlapping the inclined portion 24*b* of the first bank 24. Therefore, the display device 1 can achieve the designed luminous efficiency and secure sufficient luminance in front view.

In the display device 1 according to the present embodiment, the color filter 51 is stacked on the sealing film 26 to be in direct contact with the sealing film 26, and no circularly polarizing plate is provided facing the light-emitting elements 3. This configuration suppresses reduction in luminance of light transmitted through the color filter 51 and output to the outside, thereby enhancing the luminance in front view, as compared with the case where a circularly polarizing plate is provided.

The pixel electrode inclined portion 32*b* and the counter electrode inclined portion 33*b* are inclined with respect to the substrate 21 in the area overlapping the inclined portion 24*b* of the first bank 24. More specifically, the normal direction of the pixel electrode inclined portions 32*b* of the pixel electrodes 32 intersects the light-blocking layer 52. The normal direction of the counter electrode inclined portions 33*b* of the counter electrodes 33 intersects the light-blocking layer 52.

External light La incident into the display device 1 from the outside passes through the color filter 51R, the sealing film 26, and the counter electrode 33 made of a transflective metal film and is incident on the pixel electrode inclined portion 32*b*. Light reflected by the pixel electrode inclined portion 32*b* travels in an oblique direction toward the adjacent sub-pixel SPX-B and is incident on and blocked by the light-blocking layer 52.

Similarly, external light Lb incident into the display device 1 from the outside passes through the color filter 51R and the sealing film 26 and is incident on the counter electrode inclined portion 33*b* made of a transflective metal film. Part of the external light Lb incident on the counter electrode inclined portion 33*b* is reflected by the counter electrode inclined portion 33*b*. The light reflected by the counter electrode inclined portion 33*b* travels in an oblique direction toward the adjacent sub-pixel SPX-B and is incident on and blocked by the light-blocking layer 52.

The external light La and Lb passes through the color filter 51R and is turned into red light. Therefore, the light reflected by the pixel electrode inclined portion 32*b* and the counter electrode inclined portion 33*b* and traveling farther from the light-blocking layer 52 toward the adjacent sub-pixel SPX-B is absorbed by the color filter 51B and is not transmitted to the outside.

As described above, the display device 1 according to the present embodiment has no circularly polarizing plate and can reduce emission of reflected light to the outside of the display device 1 when external light L (external light La and Lb) incident on the display device 1 from the outside is reflected by the pixel electrode 32 and the counter electrode 33. Therefore, the display device 1 according to the present embodiment can reduce reflection of external light on the pixel electrode 32 and the counter electrode 33.

As described above, the thickness t1 of the flat portion 24*a* of the first bank 24 is greater than the thickness t2 of the bottom portion 25*a* of the second bank 25. Therefore, the wall portion 25*b* of the second bank 25 is inclined along the inclined portion 24*b* of the first bank 24. The counter electrode inclined portion 33*b* provided on the wall portion 25*b* of the second bank 25 is also inclined along the inclined portion 24*b* of the first bank 24.

The sealing film 26 is provided along the recesses and protrusions formed by the first banks 24, the second banks 25, and the light-emitting elements 3. As a result, the upper surface of the sealing film 26 has recesses in the areas overlapping the bottom portions 25*a* of the second banks 25. The light-blocking layer 52 is provided in the recesses of the sealing film 26, that is, in the areas overlapping the bottom portions 25*a* of the second banks 25 in the sealing film 26.

As a result, the light-blocking layer 52 is disposed closer to the planarization film 23 than in the case where the upper surface of the second bank 25 is formed flat, that is, flush with the upper end (opening end 25*e*) of the wall portion 25*b*. In this case, the distance between the light-blocking layer 52 and the surface of the planarization film 23 in the third direction Dz is closer to the distance between the light-emitting portion (light-emitting layer 31) of the light-emitting element 3 and the surface of the planarization film 23 in the area overlapping the flat portion 24*a* of the first bank 24. Therefore, the display device 1 can provide excellent viewing angle characteristics.

Figure 5:
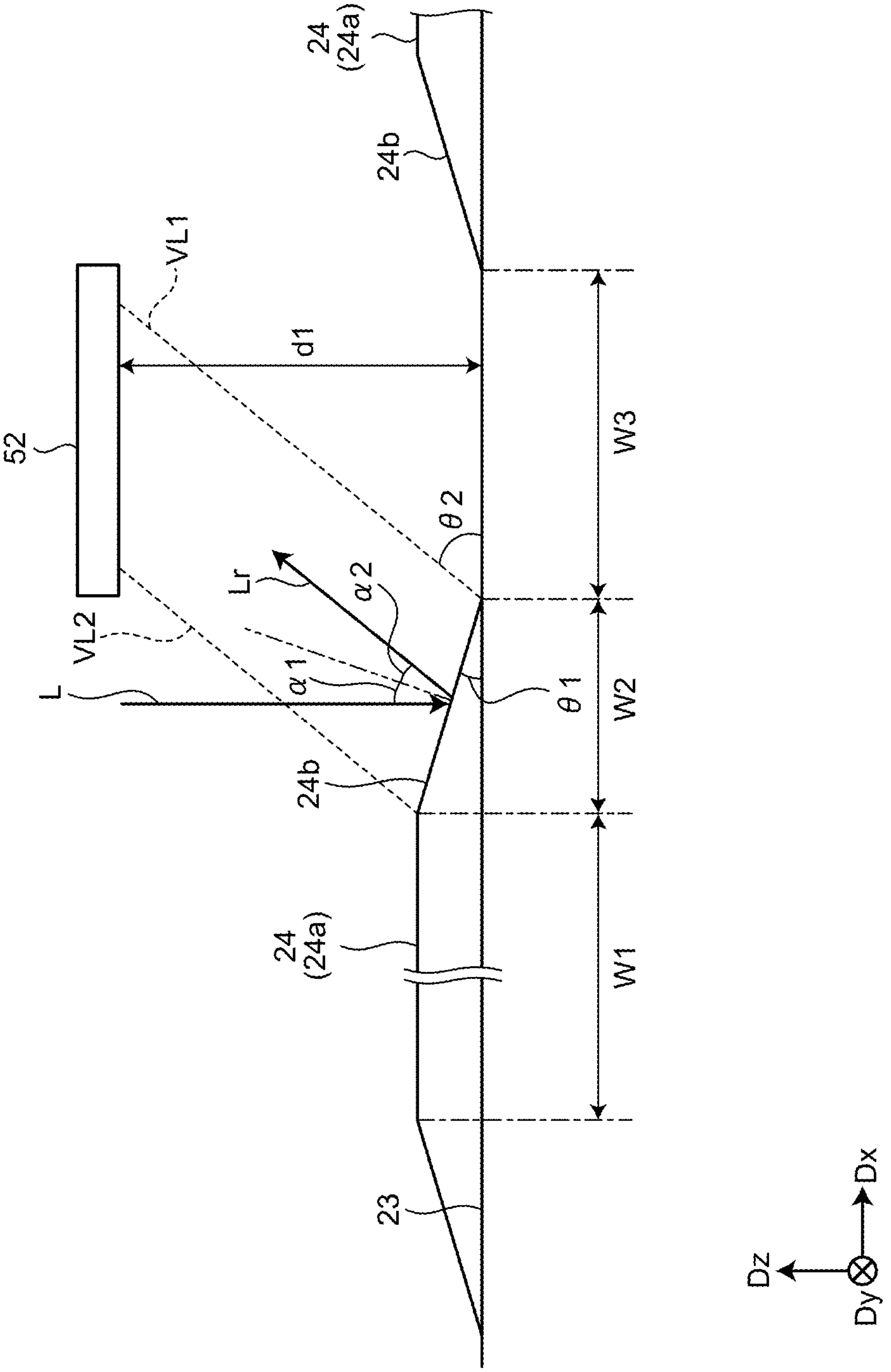
FIG. 5 is a view for explaining the positional relation between the first bank and the light-blocking layer.

FIG. 5 is a view for explaining the positional relation between the first bank and the light-blocking layer. In FIG. 5, the pixel electrode 32, the light-emitting layer 31, and the counter electrode 33 are not illustrated because they are assumed to be sufficiently thin compared with the first bank 24 and be provided substantially parallel to the first bank 24.

The inclined portion 24*b* of the first bank 24 is inclined at an angle θ1 with respect to the surface of the planarization film 23. An incidence angle α1 and a reflection angle α2 of the external light L with respect to the inclined portion 24*b* of the first bank 24 satisfy α1=α2=θ1. An imaginary line VL1 is a line passing through the lower end of the inclined portion 24*b* (coupling portion between the inclined portion 24*b* and the planarization film 23) and being parallel to the traveling direction of reflected light Lr. An imaginary line VL2 is a line passing through the upper end of the inclined portion 24*b* (coupling portion between the inclined portion 24*b* and the flat portion 24*a*) and being parallel to the traveling direction of the reflected light Lr. An angle θ2 between the imaginary lines VL1 and VL2 and the surface of the planarization film 23 satisfies θ2=90°−θ1×2.

The width of the light-blocking layer 52 and a distance d1 between the light-blocking layer 52 and the planarization film 23 in the third direction Dz are set such that the light-blocking layer 52 intersects the imaginary lines VL1 and VL2. As a result, the reflected light Lr reflected by the pixel electrode 32 and the counter electrode 33 is blocked by the light-blocking layer 52. For example, the width W1 of the flat portion 24*a* of the first bank 24 is 20 μm, the width W2 of the inclined portion 24*b* of the first bank 24 is 5 μm, and the distance W3 between the adjacent first banks 24 is 10 μm. The angle θ1 of the inclined portion 24*b* is 20°. The width of the light-blocking layer 52 is equivalent to the distance W3, and the distance d1 between the light-blocking layer 52 and the planarization film 23 in the third direction Dz is approximately 12 μm.

The widths W1 and W2, the distance W3, and the angle θ1 of the first bank 24 illustrated in FIG. 5 are given by way of example only and can be appropriately changed. While the inclined portion 24*b* of the first bank 24 is linearly provided in FIGS. 4 and 5, it may have a curved portion. For example, the flat portion 24*a* and the inclined portion 24*b* may be coupled with a smooth curved portion. The bottom portion 25*a* and the wall portion 25*b* of the second bank 25 may also be coupled with a smooth curved portion.

Second Embodiment

Figure 6:
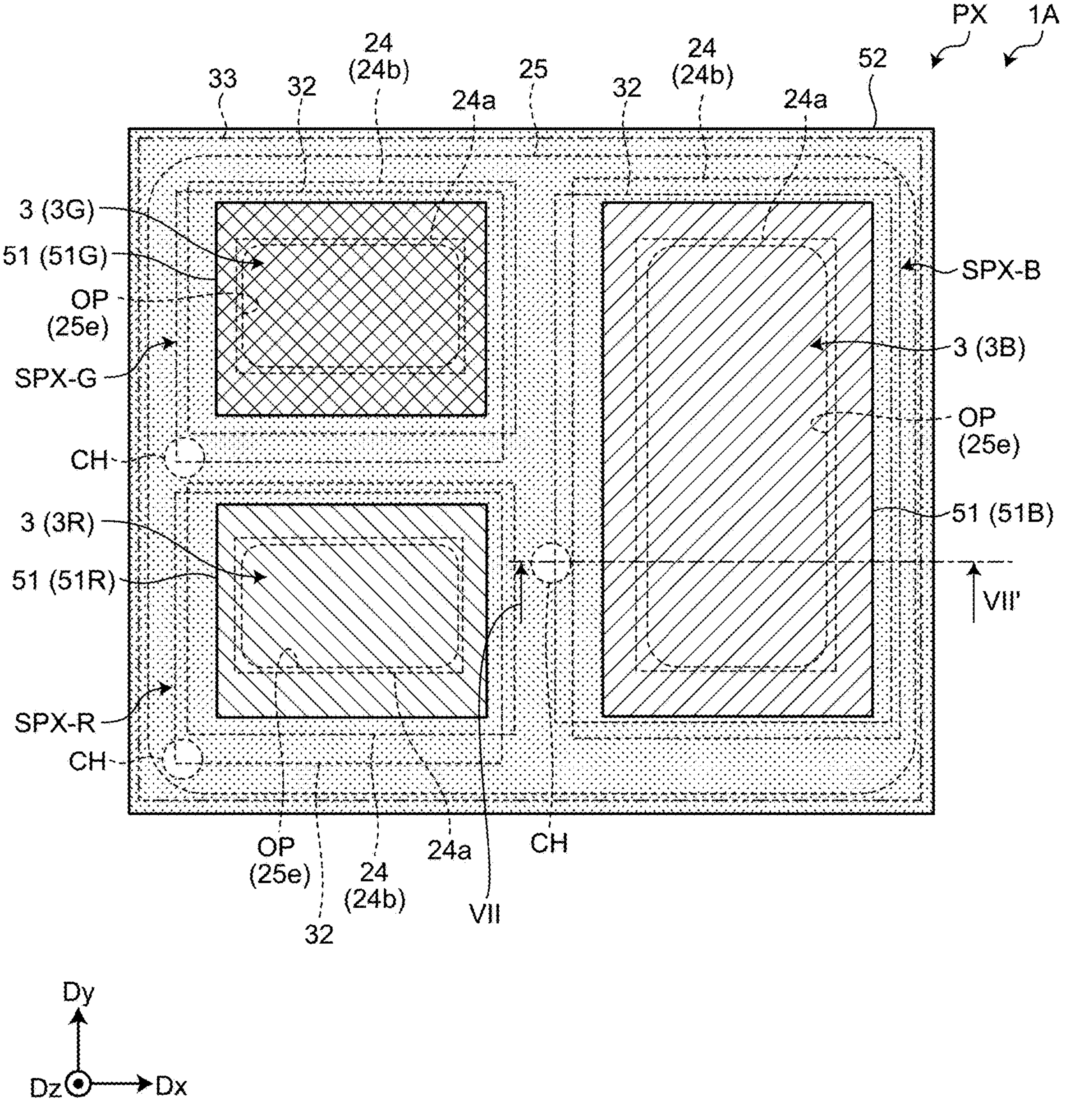
FIG. 6 is a plan view of the pixel of the display device according to a second embodiment.
Figure 7:
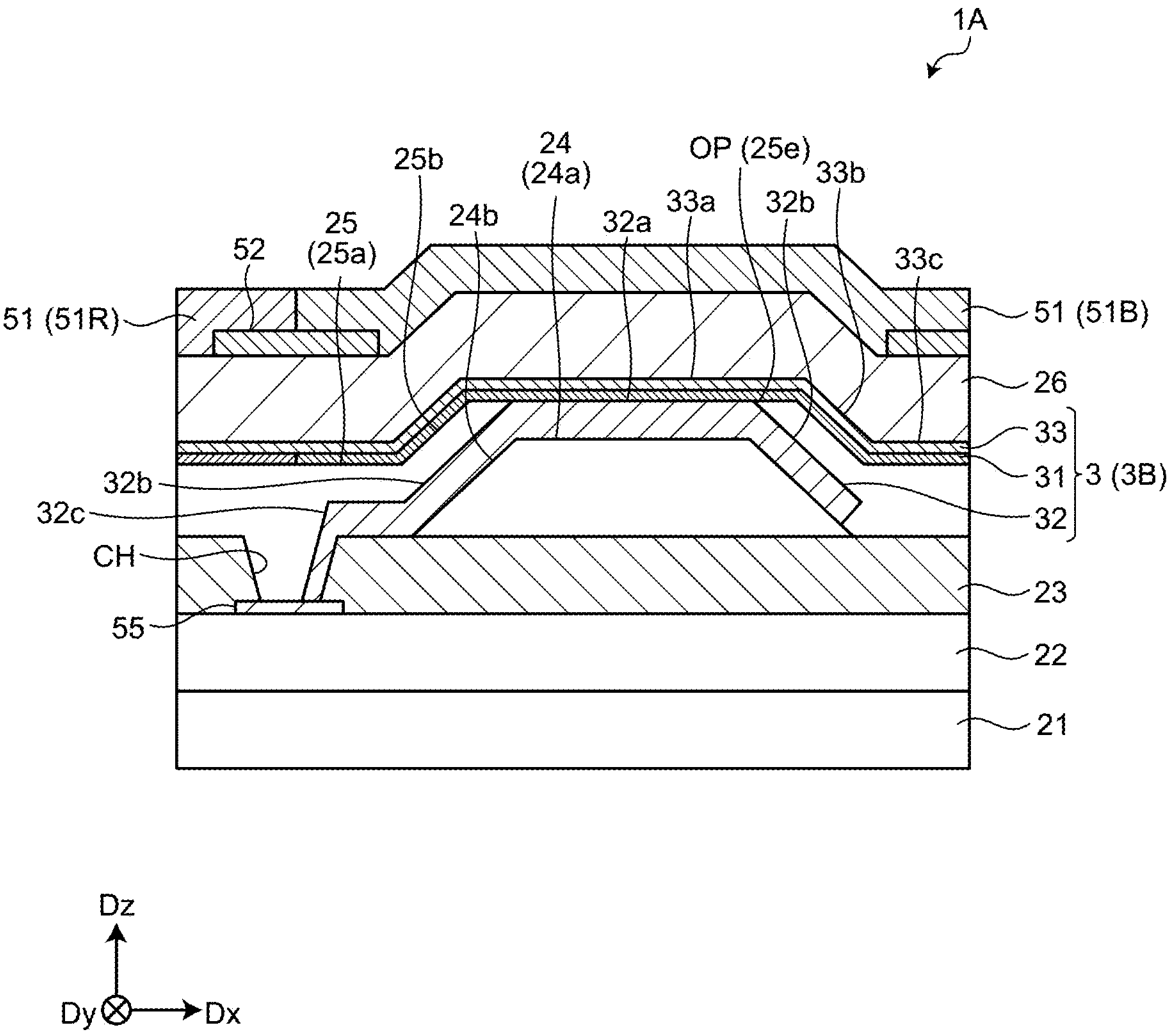
FIG. 7 is a sectional view along line VII-VII' of FIG. 6.

FIG. 6 is a plan view of the pixel of the display device according to a second embodiment. FIG. 7 is a sectional view along line VII-VII' of FIG. 6. In the following description, the same components as those described in the embodiment above are denoted by the same reference numerals, and duplicated explanation is omitted.

As illustrated in FIGS. 6 and 7, in a display device 1A according to the second embodiment, the planarization film 23 has contact holes CH passing therethrough in the third direction Dz. As illustrated in FIG. 6, the contact holes CH are formed corresponding to the sub-pixels SPX. The contact hole CH is formed at a position not overlapping the first bank 24 but overlapping the light-blocking layer 52 in plan view.

As illustrated in FIG. 7, the circuit formation layer 22 on the substrate 21 is provided with a plurality of wiring lines 55. While one wiring line 55 is illustrated in FIG. 7, the wiring lines 55 are provided for the respective sub-pixels SPX. The wiring line 55 is electrically coupled to a transistor (not illustrated) provided on the circuit formation layer 22, for example, to supply pixel signals to the pixel electrode 32 of the light-emitting element 3.

The planarization film 23 is provided on the circuit formation layer 22 to cover the wiring lines 55. The contact hole CH is formed in the area overlapping the wiring line 55 in the planarization film 23. The pixel electrode 32 includes a coupling portion 32*c* extending from the pixel electrode inclined portion 32*b* onto the planarization film 23. The coupling portion 32*c* of the pixel electrode 32 is electrically coupled to the wiring line 55 through the contact hole CH. More specifically, the coupling portion 32*c* of the pixel electrode 32 extends in the area overlapping the contact hole CH and is coupled to the wiring line 55 at the bottom of the contact hole CH.

The contact hole CH according to the present embodiment is formed at a position overlapping the light-blocking layer 52. With this configuration, if the external light La and Lb (refer to FIG. 4) incident into the contact hole CH is reflected by the coupling portion 32*c* in the contact hole CH, the reflected light from the coupling portion 32*c* is blocked by the light-blocking layer 52. Therefore, the display device 1A can reduce reflection of external light not only on the pixel electrode 32 and the counter electrode 33 but also on the coupling portion 32*c* in the contact hole CH.

Third Embodiment

Figure 8:
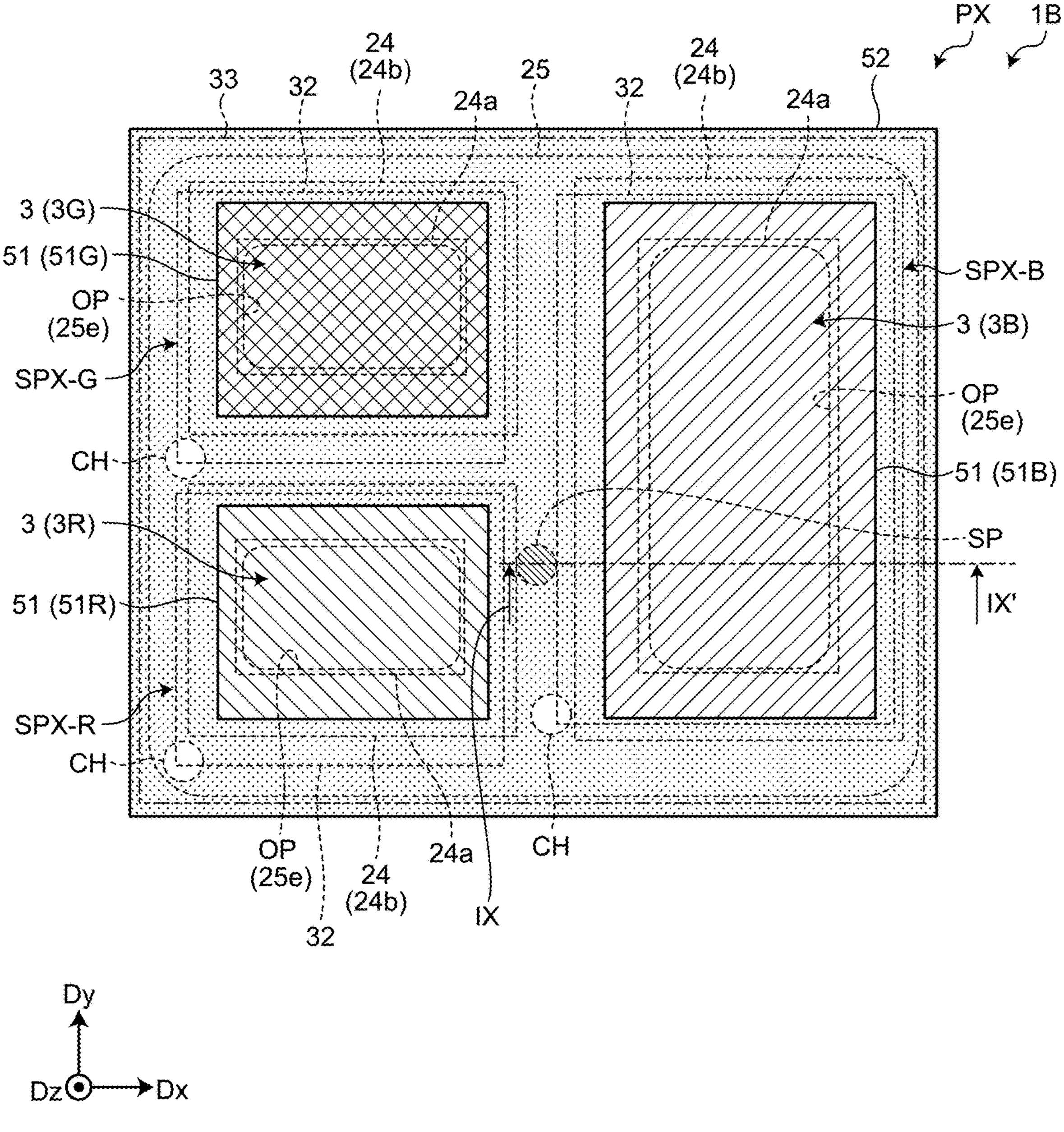
FIG. 8 is a plan view of the pixel of the display device according to a third embodiment.
Figure 9:
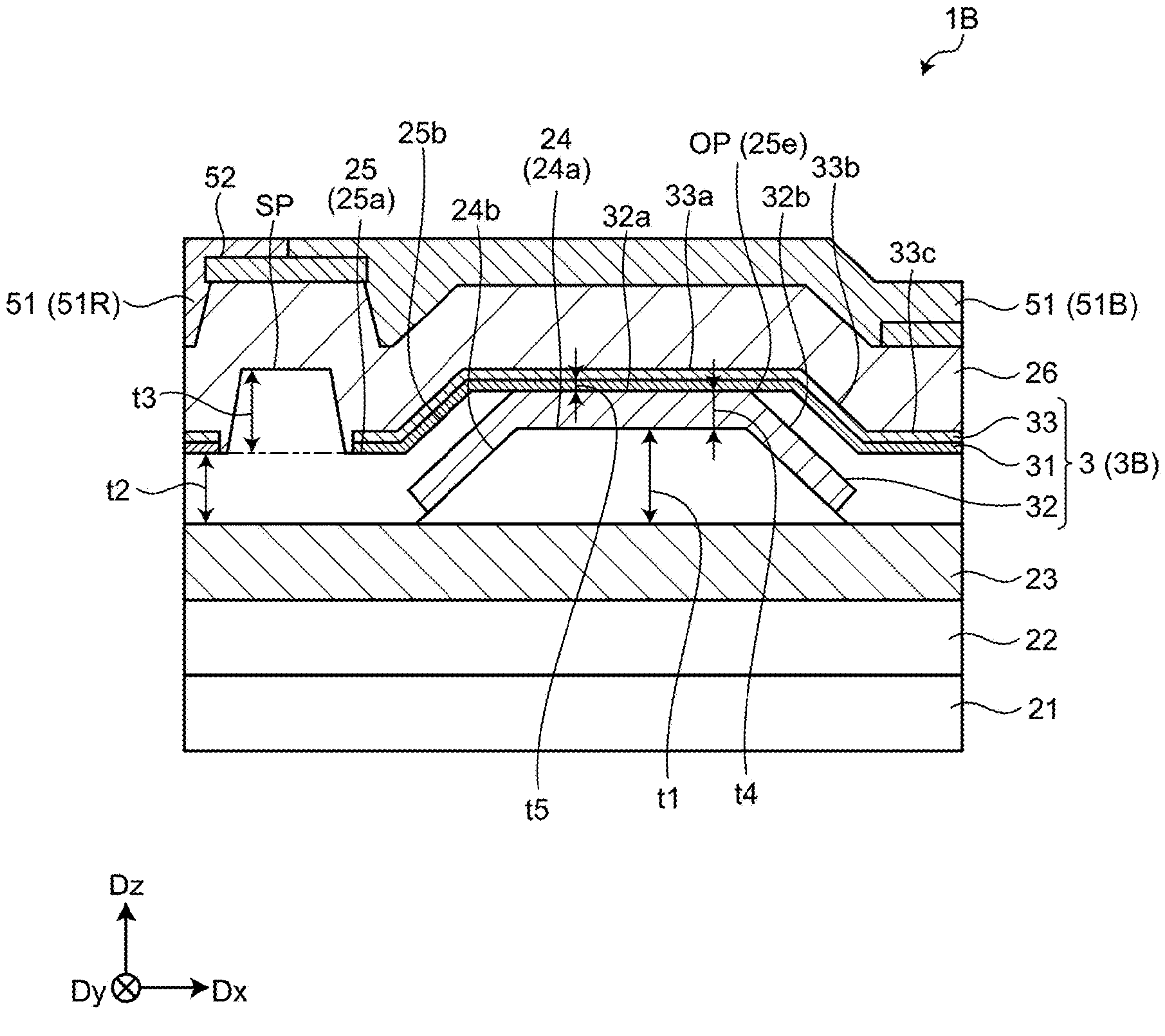
FIG. 9 is a sectional view along line IX-IX' of FIG. 8.

FIG. 8 is a plan view of the pixel of the display device according to a third embodiment. FIG. 9 is a sectional view along line IX-IX' of FIG. 8. As illustrated in FIGS. 8 and 9, a display device 1B according to the third embodiment further includes protrusions SP. The protrusion SP is provided between the first bank 24 of the sub-pixel SPX-R and the first bank 24 of the sub-pixel SPX-B adjacently disposed in the first direction Dx. In FIG. 8, one protrusion SP is provided to one pixel PX. The protrusion SP is provided at a position overlapping the light-blocking layer 52 in plan view.

The protrusion SP is a spacer to support a fine mask during vapor deposition of the light-emitting layer 31. A protective layer (not illustrated) is a cover glass, for example. Alternatively, the protective layer (not illustrated) may be a light-transmitting resin substrate. The position of the protrusion SP in the pixel PX can also be appropriately changed. For example, the protrusion SP may be provided between the sub-pixel SPX-G and the sub-pixel SPX-B adjacently disposed in the first direction Dx or between the sub-pixel SPX-G and the sub-pixel SPX-R adjacently disposed in the second direction Dy.

As illustrated in FIG. 9, the bottom portion 25*a* of the second bank 25 is provided with the protrusion SP protruding in a direction perpendicular to the substrate 21. The upper surface of the protrusion SP is higher than at least the upper surface of the light-emitting layer 31. In other words, the total thickness (t2+t3) of the thickness t2 of the bottom portion 25*a* of the second bank 25 and the thickness t3 of the protrusion SP is greater than the total thickness (t1+t4+t5) of the thickness t1 of the flat portion 24*a* of the first bank 24, the thickness t4 of the pixel electrode 32, and the thickness t5 of the light-emitting layer 31. For example, the thickness t1 of the flat portion 24*a* of the first bank 24 is approximately 1 μm, the thickness t2 of the bottom portion 25*a* of the second bank 25 is approximately 0.8 μm, and the thickness t3 of the protrusion SP of the second bank 25 is approximately 0.8 μm. The thickness t4 of the pixel electrode 32 is approximately 150 nm, and the thickness t5 of the light-emitting layer 31 is approximately 300 nm. In other words, the total thickness (t2+t3) on the planarization film 23 in the area provided with the protrusion SP is 1.6 μm, which is greater than the total thickness (t1+t4+t5) of the thickness t1 of the flat portion 24*a* of the first bank 24, the thickness t4 of the pixel electrode 32, and the thickness t5 of the light-emitting layer 31.

With this configuration, the protrusion SP according to the present embodiment can prevent the fine mask from contacting the pixel electrode flat portion 32*a* and the wall portion 25*b* of the second bank 25 during vapor deposition of the light-emitting layer 31.

The protrusion SP has a columnar shape. The configuration is not limited thereto, and the shape of the protrusion SP in plan view can be appropriately changed. The protrusion SP may have a triangular, quadrilateral, polygonal, elliptic, or cross-shape in plan view, for example.

While exemplary embodiments according to the present disclosure have been described, the embodiments are not intended to limit the disclosure. The contents disclosed in the embodiments are given by way of example only, and various modifications may be made without departing from the spirit of the present disclosure. Appropriate modifications made without departing from the spirit of the present disclosure naturally fall within the technical scope of the disclosure. At least one of various omissions, substitutions, and modifications of the components may be made without departing from the gist of the embodiments and the modifications described above.

What is claimed is:

1. A display device comprising:

a substrate;

a plurality of first banks each having a protruding shape, provided on the substrate, and comprising a flat portion and an inclined portion provided to a periphery of the flat portion;

a plurality of light-emitting elements including pixel electrodes, a light-emitting layer, and counter electrodes stacked on the first banks in the order as listed;

a sealing film covering the light-emitting elements;

a plurality of color filters that are provided on the sealing film to be in direct contact with the sealing film and are colored corresponding to the pixel electrodes; and a light-blocking layer provided between adjacent pixel electrodes of the pixel electrodes in plan view, wherein an upper surface of the flat portion of each of the first banks extends in parallel with an upper surface of the substrate, an upper surface of the inclined portion of each of the first banks is inclined with respect to the upper surface of the substrate, a distance from the upper surface of the substrate to the upper surface of the flat portion of each of the first banks is greater than a distance from the upper surface of the substrate to the upper surface of the inclined portion of each of the first banks, in a first direction perpendicular to the substrate, each pixel electrode includes a pixel electrode flat portion provided on the flat portion of a corresponding one of the first banks and a pixel electrode inclined portion inclined with respect to the substrate on the inclined portion of the corresponding first bank, the pixel electrode flat portion is in direct contact with the light-emitting layer, and each counter electrode is made of a transflective metal film and includes a counter electrode flat portion provided along the pixel electrode flat portion in an area overlapping the flat portion of the first bank and a counter electrode inclined portion provided along the pixel electrode inclined portion in an area overlapping the inclined portion of the first bank.

2. The display device according to claim 1, further comprising:

a second bank provided between adjacent pixel electrodes of the pixel electrodes and having openings in areas overlapping the pixel electrode flat portions, wherein the second bank includes a bottom portion provided between adjacent first banks of the first banks and a wall portion covering the inclined portions of the first banks, the pixel electrode flat portion, the light-emitting layer, and the counter electrode flat portion are stacked in the order as listed, in the area overlapping the flat portion of each of the first banks, and the pixel electrode inclined portion, the wall portion of the second bank, the light-emitting layer, and the counter electrode inclined portion are stacked in the order as listed, in the area overlapping the inclined portion of the first bank.

3. The display device according to claim 2, wherein the thickness of the flat portion of the first bank is greater than the thickness of the bottom portion of the second bank in the first direction.

4. The display device according to claim 1, wherein a normal direction of each of the pixel electrode inclined portions of the pixel electrodes intersects the light-blocking layer, and a normal direction of each of the counter electrode inclined portions of the counter electrodes intersects the light-blocking layer.

5. The display device according to claim 1, wherein the light-blocking layer is provided between the sealing film and the color filter.

6. The display device according to claim 1, further comprising:

a plurality of wiring lines provided to the substrate; and a planarization film covering the wiring lines, wherein each of the first banks is provided on the planarization film, a contact hole is formed at a position not overlapping the first bank but overlapping the light-blocking layer in the planarization film, and each of the pixel electrodes is electrically coupled to a corresponding wiring line of the wiring lines through the contact hole.

7. The display device according to claim 2, further comprising:

a protrusion provided to the bottom portion of the second bank and protruding in a direction perpendicular to the substrate, wherein the protrusion is provided at a position overlapping the light-blocking layer.

8. The display device according to claim 1, wherein a thickness of the flat portion of each of the first banks is greater than a thickness of the inclined portion of each of the first banks in the first direction.

9. The display device according to claim 1, wherein the light-emitting layer includes a light-emitting layer flat portion provided on the pixel electrode flat portion to be in direct contact with the pixel electrode flat portion and a light-emitting layer inclined portion provided on the pixel electrode inclined portion to be in direct contact with the pixel electrode inclined portion, and the light-emitting layer flat portion emits light in accordance with a voltage between the pixel electrode flat portion and the counter electrode flat portion.

10. The display device according to claim 9, wherein a distance from the upper surface of the substrate to an upper surface of the pixel electrode flat portion is greater than a distance from the upper surface of the substrate to an upper surface of the pixel electrode inclined portion, in the first direction.

11. A display device comprising:

a substrate including an upper surface;

a first sub-pixel disposed above the upper surface of the substrate, the first sub-pixel including a first bank above the upper surface of the substrate, a pixel electrode on the first bank, a light-emitting layer on the pixel electrode, and a counter electrode on the light-emitting layer; and a sealing film covering the first sub-pixel;

wherein the first bank, the pixel electrode, the light-emitting layer, and the counter electrode are stacked in a first direction perpendicular to the upper surface of the substrate, the first bank includes a lower surface, an inclined surface, and an upper surface, the lower surface of the first bank and the upper surface of the first bank face each other, are spaced apart from each other, and extend in parallel with the upper surface of the substrate, a distance from the upper surface of the substrate to the upper surface of the first bank is greater than a distance from the upper surface of the substrate to the lower surface of the first bank in the first direction, the inclined surface of the first bank is inclined with respect to the upper surface of the substrate and connects the lower surface of the first bank to the upper surface of the first bank, the pixel electrode includes a pixel electrode flat portion on the upper surface of the first bank to be in direct contact with the upper surface of the first bank and a pixel electrode inclined portion on the inclined surface of the first bank to be in direct contact with the inclined surface of the first bank, the light-emitting layer includes a light-emitting layer flat portion on the pixel electrode flat portion to be in direct contact with the pixel electrode flat portion and a light-emitting layer inclined portion overlapping the pixel electrode inclined portion in the first direction, and the counter electrode includes a counter electrode flat portion on the light-emitting layer flat portion to be in direct contact with the light-emitting layer flat portion and a counter electrode inclined portion on the light-emitting layer inclined portion to be in direct contact with the light-emitting layer inclined portion.

12. The display device according to claim 11, wherein the light-emitting layer flat portion and the counter electrode flat portion extend in parallel with an upper surface of the substrate, the light-emitting layer inclined portion and the counter electrode inclined portion are inclined with respect to the upper surface of the substrate, and the light-emitting layer flat portion emits light in accordance with a voltage difference between the pixel electrode flat portion and the counter electrode flat portion.

13. The display device according to claim 12, further comprising:

a second sub-pixel above the upper surface of the substrate, the first sub-pixel and the second sub-pixel being arranged in a second direction crossing the first direction; and a second bank provided on the pixel electrode of the first sub-pixel, including an opening overlapping the pixel electrode flat portion of the pixel electrode of the first sub-pixel;

wherein the second bank includes a bottom portion provided between the first sub-pixel and the second sub-pixel in the second direction, the bottom portion not overlapping the pixel electrode of the first sub-pixel in the first direction, and a wall portion covering the pixel electrode inclined portion of pixel electrode of the first sub-pixel, the wall portion not overlapping the pixel electrode flat portion of the pixel electrode of the first sub-pixel in the first direction.

14. The display device according to claim 13, wherein the wall portion of the second bank is located between the pixel electrode inclined portion of the pixel electrode of the first sub-pixel and the light-emitting layer inclined portion of the first sub-pixel, the wall portion of the second bank is in direct contact with the pixel electrode inclined portion of the pixel electrode of the first sub-pixel, and the light-emitting layer inclined portion of the first sub-pixel.

15. The display device according to claim 14, wherein the bottom portion of the second bank is not in direct contact with the pixel electrode inclined portion of the first sub-pixel.

16. The display device according to claim 15, further comprising:

a color filter provided on the sealing film and opposing the pixel electrode of the first sub-pixel; and a light-blocking layer provided on the sealing film, the light-blocking layer located between the first sub-pixel and the second sub-pixel in plan view;

wherein a normal direction of the pixel electrode inclined portion of the pixel electrode of the first sub-pixel intersects the light-blocking layer.

17. The display device according to claim 16, wherein the counter electrode of the first sub-pixel is made of a transflective metal, and a normal direction of the counter electrode inclined portion of the counter electrode of the first sub-pixel intersects the light-blocking layer.

18. The display device according to claim 16, wherein the light-blocking layer overlaps the bottom portion of the second bank in plan view.

19. The display device according to claim 18, wherein the light-blocking layer does not overlap the first bank of the first sub-pixel in plan view.

20. The display device according to claim 13, further comprising:

a protrusion provided to the bottom portion of the second bank at a position overlapping the light-blocking layer in plan view;

wherein the protrusion protrudes toward the light-blocking layer in the first direction.

* * * * *